(12) United States Patent
Ko

(10) Patent No.: US 9,281,033 B2
(45) Date of Patent: Mar. 8, 2016

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Bok Rim Ko, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 30 days.

(21) Appl. No.: 14/284,543

(22) Filed: May 22, 2014

(65) Prior Publication Data

US 2015/0194199 A1    Jul. 9, 2015

(30) Foreign Application Priority Data

Jan. 6, 2014    (KR) ........................ 10-2014-0001343

(51) Int. Cl.
| | |
|---|---|
| G11C 7/00 | (2006.01) |
| G11C 7/22 | (2006.01) |
| G11C 7/24 | (2006.01) |
| G11C 7/20 | (2006.01) |
| G11C 7/10 | (2006.01) |

(52) U.S. Cl.
CPC ............... *G11C 7/22* (2013.01); *G11C 7/1009* (2013.01); *G11C 7/20* (2013.01); *G11C 7/24* (2013.01)

(58) Field of Classification Search
CPC ............... G11C 7/22; G11C 7/20; G11C 7/24
USPC ........... 365/191, 189.05, 240, 230.06, 230.08
See application file for complete search history.

(56) References Cited

U.S. PATENT DOCUMENTS

| | | | |
|---|---|---|---|
| 8,817,556 B2 * | 8/2014 | Ko et al. ........................ 365/191 |
| 2009/0097329 A1 | 4/2009 | Yoko | |
| 2010/0034045 A1 * | 2/2010 | Sato ............................. 365/236 |
| 2010/0142306 A1 * | 6/2010 | Nakamura et al. ............ 365/227 |
| 2012/0327734 A1 * | 12/2012 | Sato ............................. 365/226 |
| 2013/0077429 A1 * | 3/2013 | Kondo ..................... 365/230.06 |

FOREIGN PATENT DOCUMENTS

KR      1020030057642 A      7/2003

\* cited by examiner

*Primary Examiner* — Toan Le
(74) *Attorney, Agent, or Firm* — William Park & Associates Ltd.

(57) ABSTRACT

The semiconductor device may include a first internal command generator suitable generating first internal command signals after decoding the external command signals in response to the external control signal, a column control signal generator suitable for generating a column control signal after decoding the external command signals in response to the external control signal, and a second internal command generator suitable for generating second internal command signals from the first internal command signals in response to the column control signal. Related systems are also provided.

20 Claims, 6 Drawing Sheets

FIG.5

|  | CKE | CS | CA0 | CA1 | CA2 | CA3 | CA4 | CA5 |
|---|---|---|---|---|---|---|---|---|
| WT1B | H | H | L | L | H | L | L | BL |
|  |  | L | BA0 | BA1 | BA2 | V | C9 | AP |
| MWT1B | H | H | L | L | H | H | L | BL |
|  |  | L | BA0 | BA1 | BA2 | V | C9 | AP |
| RD1B | H | H | L | H | L | L | L | BL |
|  |  | L | BA0 | BA1 | BA2 | V | C9 | AP |
| MRR1B | H | H | L | H | H | H | L | OP7 |
|  |  | L | MA0 | MA1 | MA2 | MA3 | MA4 | MA5 |
| MPC1B | H | H | L | L | L | L | L | OP6 |
|  |  | L | OP0 | OP1 | OP2 | OP3 | OP4 | OP5 |
| CAS2B | H | H | L | H | L | L | H | C8 |
|  |  | L | C2 | C3 | C4 | C5 | C6 | C7 |

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2014-0001343, filed on Jan. 6, 2014, in the Korean Intellectual Property Office, which is incorporated herein by reference in its entirety as set forth in full.

BACKGROUND

1. Technical Field

Various embodiments generally relate to semiconductor integrated circuits and, more particularly, to semiconductor devices and semiconductor systems including the same.

2. Related Art

Ways to reduce the weight of mobile systems such as portable computers, personal digital assistants (PDAs) and portable phones have been developed to increase the portability of these devices. Batteries that supply electric power to the mobile systems largely affect the total weight of the mobile systems. If the power consumption of the semiconductor devices employed in the mobile systems is lowered, then the capacity of the batteries may also be reduced. This in turn may then decrease the total weight of the mobile system(s). Quicker processing performance by the mobile systems are increasingly in demand with the development of multi-functional mobile systems. Accordingly, data transmission speeds of the semiconductor devices may be important factors in determination of operation speeds of the high performance mobile systems.

Semiconductor devices have been designed to simultaneously receive command signals and address signals through a plurality of pins.

In the case of synchronous semiconductor devices, the command signals and the address signals may be inputted in synchronization with a clock signal. For example, double data rate (DDR) semiconductor devices may receive command signals and address signals in synchronization with a rising edge and a falling edge of the clock signal. Whereas single data rate (SDR) semiconductor devices may receive the command signals and the address signals in synchronization with a rising edge of the clock signal.

SUMMARY

According to an embodiment, a semiconductor device may include a first internal command generator suitable for generating first internal command signals after decoding the external command signals in response to the external control signal. The semiconductor device may also include a column control signal generator suitable for generating a column control signal after decoding the external command signals in response to the external control signal. The semiconductor device may also include a second internal command generator suitable for generating second internal command signals from the first internal command signals in response to the column control signal.

According to an embodiment, a semiconductor system may include a controller and a semiconductor device. The controller may generate an external control signal and external command signals. The semiconductor device may generate first internal command signals and a column control signal after decoding the external command signals in response to the external control signal. In addition, the semiconductor device may generate second internal command signals from the first internal command signals in response to the column control signal.

BRIEF DESCRIPTION OF THE DRAWINGS

FIG. 5 is a logic table illustration of a representation of a level combination of an external control signal and an external command signal for enabling first and second internal command signals.

DETAILED DESCRIPTION

Various embodiments will be described hereinafter with reference to the accompanying drawings. However, the embodiments described herein are for illustrative purposes only and are not intended to limit the scope of the description.

Data transmission speeds of the semiconductor devices such as mobile memory devices (also, referred to as 'mobile memory chips') may be important factors in determination of operation speeds of the high performance mobile systems.

Figure 1:
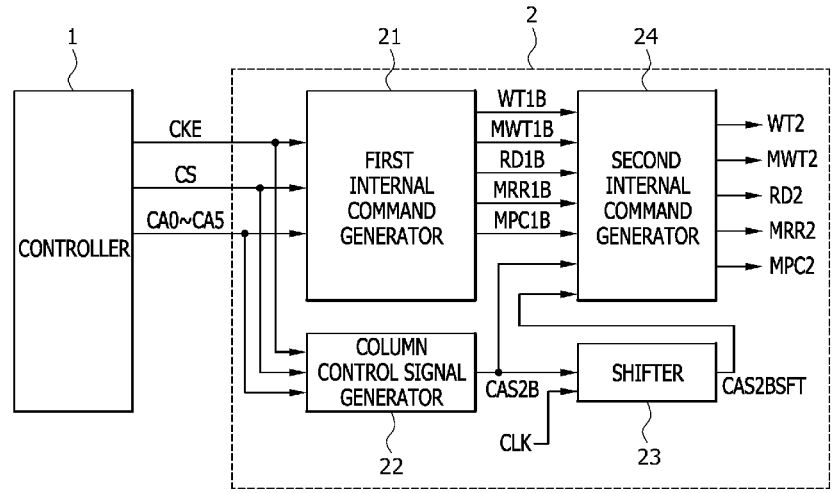
FIG. 1 is a block diagram illustrating an embodiment of a semiconductor system.

Referring to FIG. 1, a semiconductor system according to an embodiment may include a controller 1 and a semiconductor device 2. The semiconductor device 2 may include a first internal command generator 21 and a column control signal generator 22. The semiconductor device 2 may also include a shifter 23 and a second internal command generator 24.

The controller 1 may apply a clock enable signal CKE and a chip selection signal CS to the semiconductor device 2. The controller 1 may also apply first to sixth command/address signals CA0~CA5 to the semiconductor device 2. The clock enable signal CKE may be a signal which is enabled to generate an internal clock signal. The chip selection signal CS may be an external control signal which is enabled to select a chip (not shown) including the semiconductor device 2. The chip selection signal CS may be an external control signal which is enabled to select a chip (not shown) included in the semiconductor device 2. Each of the first to sixth command/address signals CA0~CA5 may include an external command signal and an external address signal. Also, each of the first to sixth command/address signals CA0~CA5 may be inputted through the same pin (not shown) to the semiconductor device 2. Alternatively, the semiconductor system may be designed such that the external command signal and the external address signal are separate signals and are inputted through different pins to the semiconductor device 2.

The first internal command generator 21 may decode the first to sixth command/address signals CA0~CA5 including external command signals in response to the clock enable signal CKE and the chip selection signal CS to generate first internal command signals. The first internal command signals may include a first write command signal WT1B, a first mask write command signal MWT1B, and a first read command signal RD1B. The first internal command signals may also include a first mode register read command signal MRR1B and a first multi-command signal MPC1B. The first internal command generator 21 may be designed such that any one among the first write command signal WT1B, the first mask write command signal MWT1B, the first read command signal RD1B, the first mode register read command signal MRR1B and the first multi-command signal MPC1B is selectively enabled according to a level combination of the first to sixth command/address signals CA0~CA5. The first internal command signals generated from the first internal command generator 21 may include at least two of the following: the first write command signal WT1B; the first mask write command signal MWT1B; the first read command signal RD1B; the first mode register read command signal MRR1B; and the first multi-command signal MPC1B according to the various embodiments.

The column control signal generator 22 may decode the first to sixth command/address signals CA0~CA5 including the external command signals in response to the clock enable signal CKE and the chip selection signal CS. After decoding the first to sixth command/address signals CA0~CA5 including the external command signals the column control signal generator 22 may generate a column control signal CAS2B. The column control signal CAS2B may be generated from the external command signals included in the first to sixth command/address signals CA0~CA5 which are inputted to the column control signal generator 22 after the first internal command signals are generated from the first internal command generator 21. The column control signal CAS2B may be enabled regardless of which of the first internal command signals (i.e., the first write command signal WT1B, the first mask write command signal MWT1B, the first read command signal RD1B, the first mode register read command signal MRR1B and the first multi-command signal MPC1B) is enabled. That is, the column control signal CAS2B may be enabled if any one of the first write command signal WT1B, the first mask write command signal MWT1B, the first read command signal RD1B, the first mode register read command signal MRR1B and the first multi-command signal MPC1B is enabled.

To generate a column shift control signal CAS2BSFT, the shifter 23 may shift the column control signal CAS2B by a predetermined period in synchronization with a clock signal CLK. The column shift control signal CAS2BSFT may be enabled after the predetermined period elapses from a point of time that the column control signal CAS2B is enabled.

The second internal command generator 24 may generate second internal command signals from the first internal command signals in response to the column control signal CAS2B and the column shift control signal CAS2BSFT. The second internal command signals may include a second write command signal WT2, a second mask write command signal MWT2, and a second read command signal RD2. The second internal command signals may also include a second mode register read command signal MRR2 and a second multi-command signal MPC2. The first internal command signals may include the first write command signal WT1B, the first mask write command signal MWT1B, and the first read command signal RD1B. The first internal command signals may also include the first mode register read command signal MRR1B and the first multi-command signal MPC1B. After the second write command signal WT2 is enabled to execute a write operation when both the first write command signal WT1B and the column control signal CAS2B are enabled, the second write command signal WT2 may be disabled if the column shift control signal CAS2BSFT is enabled. After the second mask write command signal MWT2 is enabled to execute a write operation including a masking operation (hereinafter, referred to as 'a mask write operation') for preventing data from being written into predetermined memory cells when both the first mask write command signal MWT1B and the column control signal CAS2B are enabled, the second mask write command signal MWT2 may be disabled if the column shift control signal CAS2BSFT is enabled. After the second read command signal RD2 is enabled to execute a read operation when both the first read command signal RD1B and the column control signal CAS2B are enabled, the second read command signal RD2 may be disabled if the column shift control signal CAS2BSFT is enabled. After the second mode register read command signal MRR2 is enabled to read out information stored in a mode register when both the first mode register read command signal MRR1B and the column control signal CAS2B are enabled, the second mode register read command signal MRR2 may be disabled if the column shift control signal CAS2BSFT is enabled. After the second multi-command signal MPC2 is enabled to execute a predetermined control operation when both the first multi-command signal MPC1B and the column control signal CAS2B are enabled, the second multi-command signal MPC2 may be disabled if the column shift control signal CAS2BSFT is enabled. The second internal command signals generated from the second internal command generator 24 may include at least two of the following: the second write command signal WT2; the second mask write command signal MWT2; the second read command signal RD2; the second mode register read command signal MRR2; and the second multi-command signal MPC2 according to various embodiments.

Figure 2:
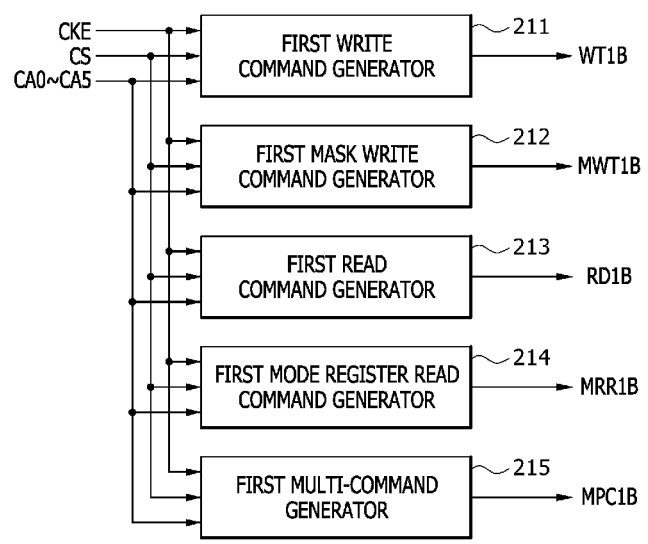
FIG. 2 is a block diagram illustration of a representation of a first internal command generator included in the semiconductor system of FIG. 1.

Referring to FIG. 2, the first internal command generator 21 may include a first write command generator 211 and a first mask write command generator 212. The first internal command generator 21 may also include a first read command generator 213, a first mode register read command generator 214, and a first multi-command generator 215.

In response to the clock enable signal CKE and the chip selection signal CS, the first write command generator 211 may decode the first to sixth command/address signals CA0~CA5 including the external command signals to generate the first write command signal WT1B enabled to have a logic "low" level. The level combination of the first to sixth command/address signals CA0~CA5 inputted to the first write command generator 211 for generating the first write command signal WT1B, which is enabled, may be set differently depending on the various embodiments.

In response to the clock enable signal CKE and the chip selection signal CS, the first mask write command generator 212 may decode the first to sixth command/address signals CA0~CA5 including the external command signals to generate the first mask write command signal MWT1B enabled to have a logic "low" level. The level combination of the first to sixth command/address signals CA0~CA5 inputted to the first mask write command generator 212 for generating the first mask write command signal MWT1B, which is enabled, may be set differently depending on the various embodiments.

In response to the clock enable signal CKE and the chip selection signal CS, the first read command generator 213 may decode the first to sixth command/address signals CA0~CA5 including the external command signals to generate the first read command signal RD1B enabled to have a logic "low" level. The level combination of the first to sixth command/address signals CA0~CA5 inputted to the first read command generator 213 for generating the first read command signal RD1B, which is enabled, may be set differently depending on the various embodiments.

In response to the clock enable signal CKE and the chip selection signal CS, the first mode register read command generator 214 may decode the first to sixth command/address signals CA0~CA5 including the external command signals to generate the first mode register read command signal MRR1B enabled to have a logic "low" level. The level combination of the first to sixth command/address signals CA0~CA5 inputted to the first mode register read command generator 214 for generating the first mode register read command signal MRR1B, which is enabled, may be set differently depending on the various embodiments.

In response to the clock enable signal CKE and the chip selection signal CS, the first multi-command generator 215 may decode the first to sixth command/address signals CA0~CA5 including the external command signals to generate the first multi-command signal MPC1B enabled to have a logic "low" level. The level combination of the first to sixth command/address signals CA0~CA5 inputted to the first multi-command generator 215 for generating the first multi-command signal MPC1B, which is enabled, may be set differently depending on the various embodiments.

Figure 3:
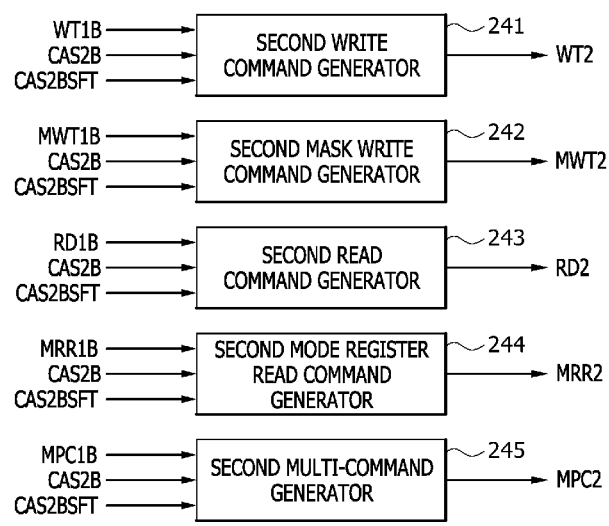
FIG. 3 is a block diagram illustration of a representation of a second internal command generator included in the semiconductor system of FIG. 1.

Referring to FIG. 3, the second internal command generator 24 may include a second write command generator 241, a second mask write command generator 242, and a second read command generator 243. The second internal command generator 24 may also include a second mode register read command generator 244 and a second multi-command generator 245.

When both the first write command signal WT1B and the column control signal CAS2B are enabled to have a logic "low" level the second write command generator 241 may generate the second write command signal WT2 enabled to have a logic "high" level. When the column shift control signal CAS2BSFT is enabled to have a logic "low" level the second write command generator 241 may generate the second write command signal WT2 disabled to have a logic "low" level.

When both the first mask write command signal MWT1B and the column control signal CAS2B are enabled to have a logic "low" level the second mask write command generator 242 may generate the second mask write command signal MWT2 enabled to have a logic "high" level. When the column shift control signal CAS2BSFT is enabled to have a logic "low" level the second mask write command generator 242 may generate the second mask write command signal MWT2 disabled to have a logic "low" level.

When both the first read command signal RD1B and the column control signal CAS2B are enabled to have a logic "low" level the second read command generator 243 may generate the second read command signal RD2 enabled to have a logic "high" level. When the column shift control signal CAS2BSFT is enabled to have a logic "low" level the second read command generator 243 may generate the second read command signal RD2 disabled to have a logic "low" level.

When both the first mode register read command signal MRR1B and the column control signal CAS2B are enabled to have a logic "low" level the second mode register read command generator 244 may generate the second mode register read command signal MRR2 enabled to have a logic "high" level. When the column shift control signal CAS2BSFT is enabled to have a logic "low" level the second mode register read command generator 244 may generate the second mode register read command signal MRR2 disabled to have a logic "low" level.

When both the first multi-command signal MPC1B and the column control signal CAS2B are enabled to have a logic "low" level the second multi-command generator 245 may generate the second multi-command signal MPC2 enabled to have a logic "high" level. When the column shift control signal CAS2BSFT is enabled to have a logic "low" level the second multi-command generator 245 may generate the second multi-command signal MPC2 disabled to have a logic "low" level.

Figure 4:
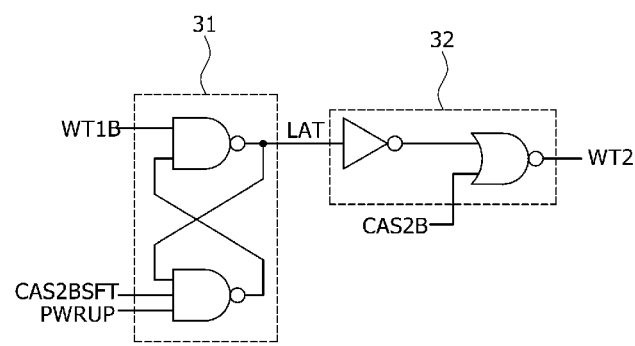
FIG. 4 is a logic circuit diagram illustration of a representation of a second write command generator included in the second internal command generator of FIG. 3.

Referring to FIG. 4, the second write command generator 241 may include a latch signal generator 31 and an output unit 32.

The latch signal generator 31 may generate a latch signal LAT in response to the first write command signal WT1B, the column shift control signal CAS2BSFT and a power-up signal PWRUP. The power-up signal PWRUP may be a signal whose level is changed from a logic "low" level to a logic "high" level when a power supply signal reaches a predetermined level after a certain period (hereinafter, referred to as 'a power-up period') elapses from a point of time that the power supply signal is applied to the semiconductor device (2 of FIG. 1). If the first write command signal WT1B is enabled after the power-up period terminates, then the latch signal generator 31 may generate the latch signal LAT having a logic "high" level. The latch signal generator 31 may generate the latch signal LAT having a logic "low" level if the column shift control signal CAS2BSFT is enabled to have a logic "low" level after a predetermined period elapses from a point of time that the column control signal CAS2B is enabled to have a logic "low" level.

In response to the latch signal LAT and the column control signal CAS2B the output unit 32 may generate the second write command signal WT2. The output unit 32 may generate the second write command signal WT2 enabled to have a logic "high" level if the column control signal CAS2B is enabled to have a logic "low" level while the latch signal LAT has a logic "high" level. If the latch signal LAT has a logic "low" level, then the output unit 32 may generate the second write command signal WT2 disabled to have a logic "low" level.

An operation of the semiconductor system having the aforementioned configuration will be described hereinafter.

First, the first internal command generator 21 (See FIG. 1) may decode the first to sixth command/address signals CA0~CA5 including external command signals in response to the clock enable signal CKE and the chip selection signal CS to enable any one of the first write command signal WT1B, the first mask write command signal MWT1B, the first read command signal RD1B, the first mode register read command signal MRR1B and the first multi-command signal MPC1B to have a logic "low" level. Hereinafter, an operation of the first internal command generator 21 for generating the first internal command signals will be described with reference to a logic table illustrated in FIG. 5.

As illustrated in FIG. 5, while the clock enable signal CKE has a logic "high(H)" level, the first internal command generator 21 may generate the first write command signal WT1B enabled to have a logic "low(L)" level if the first to fifth command/address signals CA0~CA4 having a level combination of 'L, L, H, L, L' are inputted to the first internal command generator 21 at a point of time that a level of the chip selection signal CS is changed into a logic "high(H)" level. In such a case, at a point of time that a level of the chip selection signal CS is changed into a logic "high(H)" level, the sixth command/address signal CA5 inputted to the first internal command generator 21 may include information on a burst length BL. In addition, at a point of time that a level of the chip selection signal CS is changed into a logic "low(L)" level, the first to third command/address signals CA0~CA2 may include information on bank addresses BA0~BA2 of memory cell arrays to which the write operation is applied, the fifth command/address signal CA4 may include information on a column address C9 of memory cell arrays to which the write operation is applied, and the sixth command/address signal CA5 may include information on an auto pre-charge signal AP. In FIG. 5, at a point of time that a level of the chip selection signal CS is changed into a logic "low(L)" level, the fourth command/address signal CA3 is expressed by a character "V" since no information is included in the fourth command/address signal CA3. However, the fourth command/address signal CA3 may include information on a new operation later.

As illustrated in FIG. 5, while the clock enable signal CKE has a logic "high(H)" level, the first internal command generator 21 may generate the first mask write command signal MWT1B enabled to have a logic "low(L)" level if the first to fifth command/address signals CA0~CA4 having a level combination of 'L, L, H, H, L' are inputted to the first internal command generator 21 at a point of time that a level of the chip selection signal CS is changed into a logic "high(H)" level. In such a case, at a point of time that a level of the chip selection signal CS is changed into a logic "high(H)" level, the sixth command/address signal CA5 inputted to the first internal command generator 21 may include information on the burst length BL. In addition, at a point of time that a level of the chip selection signal CS is changed into a logic "low (L)" level, the first to third command/address signals CA0~CA2 may include information on bank addresses BA0~BA2 relating to memory cell arrays to which a mask write operation is applied, the fifth command/address signal CA4 may include information on a column address C9 of memory cell arrays to which the mask write operation is applied, and the sixth command/address signal CA5 may include information on the auto pre-charge signal AP. In FIG. 5, at a point of time that a level of the chip selection signal CS is changed into a logic "low(L)" level, the fourth command/address signal CA3 is expressed by a character "V" since no information is included in the fourth command/address signal CA3. However, the fourth command/address signal CA3 may include information on a new operation later.

As illustrated in FIG. 5, while the clock enable signal CKE has a logic "high(H)" level, the first internal command generator 21 may generate the first read command signal RD1B enabled to have a logic "low(L)" level if the first to fifth command/address signals CA0~CA4 having a level combination of 'L, H, L, L, L' are inputted to the first internal command generator 21 at a point of time that a level of the chip selection signal CS is changed into a logic "high(H)" level. In such a case, at a point of time that a level of the chip selection signal CS is changed into a logic "high(H)" level, the sixth command/address signal CA5 inputted to the first internal command generator 21 may include information on the burst length BL. In addition, at a point of time that a level of the chip selection signal CS is changed into a logic "low (L)" level, the first to third command/address signals CA0~CA2 may include information on bank addresses BA0~BA2 relating to memory cell arrays to which the read operation is applied, the fifth command/address signal CA4 may include information on a column address C9 of memory cell arrays to which the read operation is applied, and the sixth command/address signal CA5 may include information on the auto pre-charge signal AP. In FIG. 5, at a point of time that a level of the chip selection signal CS is changed into a logic "low(L)" level, the fourth command/address signal CA3 is expressed by a character "V" since no information is included in the fourth command/address signal CA3. However, the fourth command/address signal CA3 may include information on a new operation later.

As illustrated in FIG. 5, while the clock enable signal CKE has a logic "high(H)" level, the first internal command generator 21 may generate the first mode register read command signal MRR1B enabled to have a logic "low(L)" level if the first to fifth command/address signals CA0~CA4 having a level combination of 'L, H, H, H, L' are inputted to the first internal command generator 21 at a point of time that a level of the chip selection signal CS is changed into a logic "high (H)" level. In such a case, at a point of time that a level of the chip selection signal CS is changed into a logic "high(H)" level, the sixth command/address signal CA5 inputted to the first internal command generator 21 may include information OP7 which is stored in a mode register. In addition, at a point of time that a level of the chip selection signal CS is changed into a logic "low(L)" level, the first to sixth command/address signals CA0~CA5 may include information on addresses MA0~MA5 of mode registers to which the read operation is applied.

As illustrated in FIG. 5, while the clock enable signal CKE has a logic "high(H)" level, the first internal command generator 21 may generate the first multi-command signal MPC1B enabled to have a logic "low(L)" level if the first to fifth command/address signals CA0~CA4 having a level combination of 'L, L, L, L, L' are inputted to the first internal command generator 21 at a point of time that a level of the chip selection signal CS is changed into a logic "high(H)" level. In such a case, at a point of time that a level of the chip selection signal CS is changed into a logic "high(H)" level, the sixth command/address signal CA5 may include information OP6 necessary to execute one of various control operations. In addition, at a point of time that a level of the chip selection signal CS is changed into a logic "low(L)" level, the first to sixth command/address signals CA0~CA5 may include information OP0~OP5 used for executing various control operations.

In response to the clock enable signal CKE and the chip selection signal CS to generate the column control signal CAS2B the column control signal generator 22 may decode the first to sixth command/address signals CA0~CA5 including the external command signals.

As illustrated in FIG. 5, while the clock enable signal CKE has a logic "high(H)" level, the column control signal generator 22 may generate the column control signal CAS2B enabled to have a logic "low(L)" level if the first to fifth command/address signals CA0~CA4 having a level combination of 'L, H, L, L, H' are inputted to the column control signal generator 22 at a point of time that a level of the chip selection signal CS is changed into a logic "high(H)" level. In such a case, at a point of time that a level of the chip selection signal CS is changed into a logic "high(H)" level, the sixth command/address signal CA5 may include information on a column address C8 of memory cells to which one of the write operation, the mask write operation, the read operation, the mode register read operation and the control operation is applied. In addition, at a point of time that a level of the chip selection signal CS is changed into a logic "low(L)" level, the first to sixth command/address signals CA0~CA5 may include information on column addresses C2~C7 of memory cells to which one of the write operation, the mask write operation, the read operation, the mode register read operation and the control operation is applied.

The shifter 23 may shift the column control signal CAS2B by a predetermined period in synchronization with the clock signal CLK to generate the column shift control signal CAS2BSFT.

In response to the column control signal CAS2B and the column shift control signal CAS2BSFT the second internal command generator 24 may generate the second internal command signals including the second write command signal WT2, the second mask write command signal MWT2, the second read command signal RD2, the second mode register read command signal MRR2 and the second multi-command signal MPC2 from the first internal command signals including the first write command signal WT1B, the first mask write command signal MWT1B, the first read command signal RD1B, the first mode register read command signal MRR1B and the first multi-command signal MPC1B.

In an embodiment, if the column control signal CAS2B is enabled to have a logic "low" level after the first write command signal WT1B is enabled to have a logic "low" level, the second write command signal WT2 may be enabled to a logic "high" level to execute the write operation. If the column control signal CAS2B is enabled to have a logic "low" level after the first mask write command signal MWT1B is enabled to have a logic "low" level, the second mask write command signal MWT2 may be enabled to a logic "high" level to execute the mask write operation. If the column control signal CAS2B is enabled to have a logic "low" level after the first read command signal RD1B is enabled to have a logic "low" level, the second read command signal RD2 may be enabled to a logic "high" level to execute the read operation. If the column control signal CAS2B is enabled to have a logic "low" level after the first mode register read command signal MRR1B is enabled to have a logic "low" level, the second mode register read command signal MRR2 may be enabled to a logic "high" level to execute the mode register read operation. If the column control signal CAS2B is enabled to have a logic "low" level after the first multi-command signal MPC1B is enabled to have a logic "low" level, the second multi-command signal MPC2 may be enabled to a logic "high" level to execute a predetermined control operation.

The second write command signal WT2 may be disabled to a logic "low" level when the column shift control signal CAS2BSFT is enabled to a logic "low" level after a predetermined period elapses from a point of time that the second write command signal WT2 is enabled to have a logic "high" level. Additionally, the second mask write command signal MWT2 may be disabled to a logic "low" level when the column shift control signal CAS2BSFT is enabled to a logic "low" level after the predetermined period elapses from a point of time that the second mask write command signal MWT2 is enabled to have a logic "high" level. Similarly, the second read command signal RD2 may be disabled to a logic "low" level when the column shift control signal CAS2BSFT is enabled to a logic "low" level after the predetermined period elapses from a point of time that the second read command signal RD2 is enabled to have a logic "high" level. Additionally, the second mode register read command signal MRR2 may be disabled to a logic "low" level when the column shift control signal CAS2BSFT is enabled to a logic "low" level after the predetermined period elapses from a point of time that the second mode register read command signal MRR2 is enabled to have a logic "high" level. Moreover, the second multi-command signal MPC2 may be disabled to a logic "low" level when the column shift control signal CAS2BSFT is enabled to a logic "low" level after the predetermined period elapses from a point of time that the second multi-command signal MPC2 is enabled to have a logic "high" level.

Logic level combinations of the first to sixth command/address signals CA0~CA5 for enabling the first write command signal WT1B, the first mask write command signal MWT1B, the first read command signal RD1B, the first mode register read command signal MRR1B, the first multi-command signal MPC1B and the column control signal CAS2B may be set differently from what is illustrated in the table of FIG. 5 depending on the various embodiments.

Figure 6:
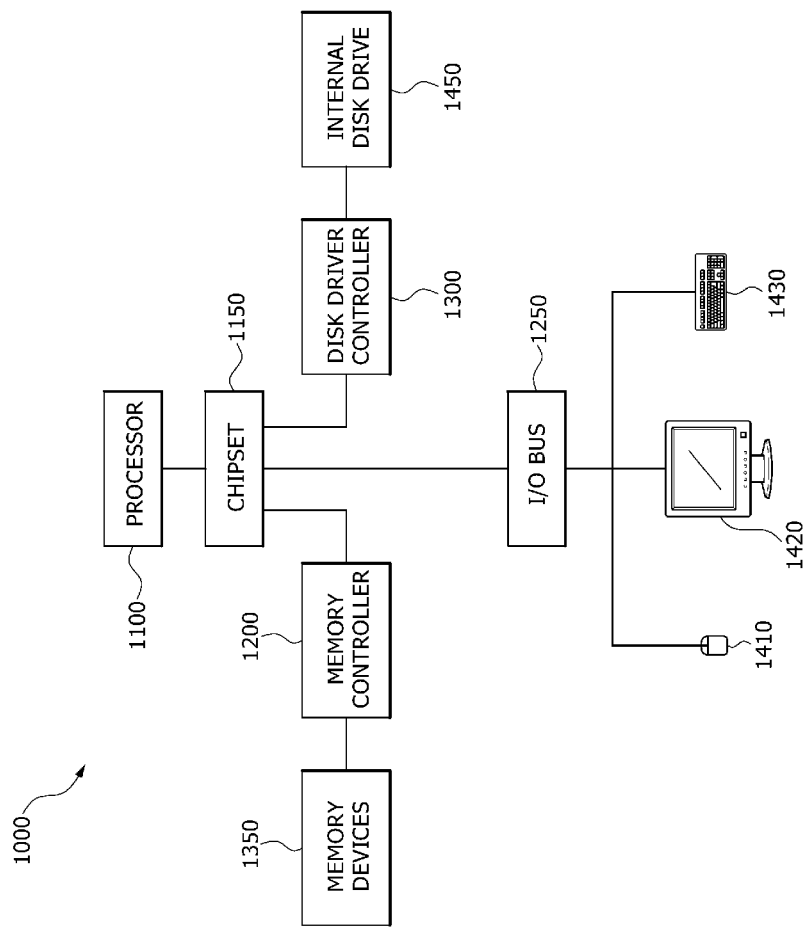
FIG. 6 illustrates a block diagram representation of a system employing the semiconductor system in accordance with the embodiments discussed above with relation to FIGS. 1-5.

The semiconductor system discussed above is particular useful in the design of memory devices, processors, and computer systems. For example, referring to FIG. 6, a block diagram of a system employing the semiconductor system in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor system as discussed above with reference to FIGS. 1-5 or controller (i.e., as shown in FIG. 1). Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor system as discussed above with relation to FIGS. 1-5 or semiconductor device 2 (i.e., as shown in FIG. 1), the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the semiconductor system as discussed above with relation to FIGS. 1-5. In alternate embodiments, such as cellular phones or digital cameras, the components may differ from the embodiments shown in FIG. 6.

As described above, a semiconductor device according to the embodiments may sequentially receive the information necessary for a write operation, a mask write operation, a read operation, a mode register read operation and a control operation for two cycle times of a chip selection signal CS using, for example, only first to sixth command/address signals CA0~CA5. That is, because the information necessary for various operations are sequentially inputted to the semiconductor device, the number of input pins of the semiconductor devices to which the command/address signals are applied may be reduced.

What is claimed is:

1. A semiconductor device comprising:
a first internal command generator suitable for generating first internal command signals after decoding an external command signals in response to an external control signal;
a column control signal generator suitable for generating a column control signal after decoding the external command signals in response to the external control signal; and
a second internal command generator suitable for generating second internal command signals from the first internal command signals in response to the column control signal.

2. The semiconductor device of claim 1, wherein the external control signal is a chip selection signal for selecting a chip including the semiconductor device.

3. The semiconductor device of claim 1, wherein the first internal command signals include at least two of first write command signals, first mask write command signals, first read command signals, first mode register read command signals and first multi-command signals.

4. The semiconductor device of claim 3, wherein the second internal command signals include at least two of second write command signals, second mask write command signals, second read command signals, second mode register read command signals, and second multi-command signals.

5. The semiconductor device of claim 4,
wherein the second write command signal is enabled to execute a write operation;
wherein the second mask write command signal is enabled to execute a write operation including a masking operation for preventing data from being written into a predetermined memory cell;
wherein the second read command signal is enabled to execute a read operation;
wherein the second mode register read command signal is enabled to read out information stored in a mode register; and
wherein the second multi-command signal is enabled to execute a predetermined control operation.

6. The semiconductor device of claim 4,
wherein the second write command signal is enabled when both the first write command signal and the column control signal are enabled;
wherein the second mask write command signal is enabled when both the first mask write command signal and the column control signal are enabled;
wherein the second read command signal is enabled when both the first read command signal and the column control signal are enabled;
wherein the second mode register read command signal is enabled when both the first mode register read command signal and the column control signal are enabled; and
wherein the second multi-command signal is enabled when both the first multi-command signal and the column control signal are enabled.

7. The semiconductor device of claim 1, further comprising a shifter suitable for receiving the column control signal and shifting the column control signal by a predetermined period to generate a column shift control signal.

8. The semiconductor device of claim 7, wherein the second internal command generator disables the second internal command signals in response to the column shift control signal.

9. The semiconductor device of claim 8,
wherein the second internal command signals are enabled if the first internal command signals and the column control signal are enabled; and
wherein the second internal command signals are disabled if the column shift control signal is enabled.

10. A semiconductor system comprising:
a controller suitable for generating an external control signal and external command signals; and
a semiconductor device suitable for generating first internal command signals and a column control signal after decoding the external command signals in response to the external control signal, and the semiconductor device suitable for generating second internal command signals from the first internal command signals in response to the column control signal.

11. The semiconductor system of claim 10, wherein the semiconductor device generates the column control signal after decoding the external command signals after the first internal command signals are generated from the external command signals.

12. The semiconductor system of claim 10, wherein the external control signal is a chip selection signal for selecting a chip including the semiconductor device.

13. The semiconductor system of claim 10, wherein the first internal command signals include at least two of first write command signals, first mask write command signals, first read command signals, first mode register read command signals and first multi-command signals.

14. The semiconductor system of claim 13, wherein the second internal command signals include at least two of second write command signals, second mask write command signals, second read command signals, second mode register read command signals and second multi-command signals.

15. The semiconductor system of claim 14,
wherein the second write command signal is enabled to execute a write operation;
wherein the second mask write command signal is enabled to execute a write operation including a masking operation for preventing data from being written into a predetermined memory cell;
wherein the second read command signal is enabled to execute a read operation;

wherein the second mode register read command signal is enabled to read out information stored in a mode register; and wherein the second multi-command signal is enabled to execute a predetermined control operation.

16. The semiconductor system of claim 14, wherein the second write command signal is enabled when both the first write command signal and the column control signal are enabled;

wherein the second mask write command signal is enabled when both the first mask write command signal and the column control signal are enabled;

wherein the second read command signal is enabled when both the first read command signal and the column control signal are enabled;

wherein the second mode register read command signal is enabled when both the first mode register read command signal and the column control signal are enabled; and wherein the second multi-command signal is enabled when both the first multi-command signal and the column control signal are enabled.

17. The semiconductor system of claim 10, wherein the semiconductor device includes:

a first internal command generator suitable for generating the first internal command signals after decoding the external command signals in response to the external control signal;

a column control signal generator suitable for generating the column control signal after decoding the external command signals in response to the external control signal; and a second internal command generator suitable for generating the second internal command signals from the first internal command signals in response to the column control signal.

18. The semiconductor system of claim 17, further comprising a shifter suitable for receiving the column control signal and shifting the column control signal by a predetermined period to generate a column shift control signal.

19. The semiconductor system of claim 18, wherein the second internal command generator disables the second internal command signals in response to the column shift control signal.

20. The semiconductor system of claim 19, wherein the second internal command signals are enabled if the first internal command signals and the column control signal are enabled; and wherein the second internal command signals are disabled if the column shift control signal is enabled.

* * * * *